(12) United States Patent
Tran et al.

(10) Patent No.: US 11,374,541 B2
(45) Date of Patent: Jun. 28, 2022

(54) COMMON MODE REJECTION FOR DIFFERENTIAL RECEIVER IN HIGH SPEED DATA CHANNEL

(71) Applicant: Raytheon Company, Waltham, MA (US)

(72) Inventors: Thanh Thien Tran, McKinney, TX (US); David G. Haedge, Dallas, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/069,725

(22) Filed: Oct. 13, 2020

(65) Prior Publication Data

US 2022/0115989 A1 Apr. 14, 2022

(51) Int. Cl.
| | |
|---|---|
| *H03F 3/45* | (2006.01) |
| *H03F 1/32* | (2006.01) |
| *H03F 1/02* | (2006.01) |
| *H03F 1/30* | (2006.01) |

(52) U.S. Cl.
CPC ......... *H03F 1/3211* (2013.01); *H03F 1/0294* (2013.01); *H03F 1/301* (2013.01); *H03F 1/3276* (2013.01); *H03F 3/45179* (2013.01)

(58) Field of Classification Search
CPC ...... H03F 1/3211; H03F 1/0294; H03F 1/301; H03F 1/3276; H03F 3/45179

USPC ................. 330/9, 124 R, 295, 310
See application file for complete search history.

(56) References Cited

U.S. PATENT DOCUMENTS

| | | | |
|---|---|---|---|
| 8,471,646 B2 | 6/2013 | Essenwanger | |
| 2006/0158229 A1 | 7/2006 | Hsu et al. | |
| 2007/0047589 A1 | 3/2007 | Modaress-Razavi et al. | |
| 2010/0329323 A1 | 12/2010 | Hsu | |

*Primary Examiner* — Khanh V Nguyen
*Assistant Examiner* — Khiem D Nguyen
(74) *Attorney, Agent, or Firm* — Burns & Levinson LLP; Joseph M. Maraia

(57) ABSTRACT

A common-mode rejection receiver including a first differential amplifier arranged to receive a differential signal including receiving a positive signal of the differential signal at a first non-inverting input port and receiving a negative signal of the differential signal at a first inverting input port, and output a first differentiated signal based on a voltage differential between the positive signal and the negative signal. A clamping circuit is arranged to limit a magnitude of the first differentiated signal to a pre-determined limit. A second differential amplifier is arranged to receive the positive signal at a second inverting input port and receive the negative signal at a second non-inverting input port, and output a second differentiated signal. A matching circuit is arranged to receive the second differentiated signal output and output a matched signal. A summing circuit adds the clamped signal and matched signal and outputs a receiver output signal.

20 Claims, 7 Drawing Sheets

COMMON MODE REJECTION FOR DIFFERENTIAL RECEIVER IN HIGH SPEED DATA CHANNEL

TECHNICAL FIELD

This application relates generally to signal processing and, more particularly, to common-mode rejection circuits.

BACKGROUND

Differential amplifiers have been used traditionally to suppress noise in electrical circuits and systems. Noise can include typical differential noise or common-mode noise which is often suppressed by a differential-to-single-ended receiver circuit, for example differential amplifier. Two typical types of common-mode noise include: noise generated in traces on printed circuit boards, wires and cables due to electromagnetic induction that causes a difference in potential (e.g., noise) between the data signal source ground and the circuit ground and; current flowing into the ground of a circuit from another circuit which causes a ground potential to rise. In either case, the ground potential, i.e., the reference for a circuit, can fluctuate because of noise. Because typical filters are often incapable of removing common-mode noise, differential amplifiers are often implemented to suppress common-mode noise.

For high speed data circuit and system designs, one of the most challenging tasks is how to prevent noise from coupling to routing channels that may cause random system failures. One conventional technique widely adopted in the industry is to convert single-ended signals to differential signals and route the signals differentially and, at the receiver, convert the differentially-routed signals back to normal single-ended signals. In this way, the receiver can reject common-mode noise. Unfortunately, a problem remains where noise does not couple evenly on the positive and negative traces of one differential pair. Designers of differential receivers have innovated many techniques to improve common-mode rejection based on an assumption that the noise coupled to each signal of one differential pair is the same. But, existing receivers have not been designed or implemented in ways to compensate for uneven noise coupling to a differential pair. In practice, it is not practical to guarantee even noise coupling to a differential pair. This is because the radiators or the high speed signal traces generating common noise are always being routed on one side of a differential pair or the other side of the same pair. In this case, the noise coupled is not even, the signal closest to the radiator has more noise than the signal further away from the radiator in one differential pair. Other conventional noise suppression techniques include carefully routing and placing data signals away from noisy circuitries which often increases system complexity and cost.

SUMMARY

The application, in various implementations, addresses deficiencies associated with existing common-mode rejection techniques for a differential receiver.

This application describes an exemplary circuit with two differential receivers monitoring common noise at two terminals, positive and negative, of a differential pair. The first receiver looks for noise on the positive terminal while the second receiver looks for noise on the negative terminal. The two receivers are designed to output two out of phase signals, and the outputs of these are inputs to a summing amplifier. In this implementation, the summing amplifier cancels the common-mode noise. For normal differential signals, the negative path may be clamped at plus and minus 0.1 volts (V), assuming that the maximum noise coupled is 100 mV in a receiver design, and this reduces the normal signal swing by 0.1 V. To compensate for this loss, gain may be added to the summing amplifier. In certain configurations, a receiver circuit uses two differential-to-single ended receivers to detect common-mode noise. The circuit may use diodes to clamp the voltage swing of one receiver path to allow for normal signals propagating through the circuit. Then a summing amplifier cancels and/or suppresses the common-mode noise. Differential mode noise can appear as normal differential signals where existing receivers in the industry cannot distinguish between normal signals and differential mode noise. The receivers, systems, and/or methods described herein, in certain implementations, advantageously solve this problem of differential mode noise appearing as normal differential signals by cancelling, suppressing, and/or rejecting such differential mode noise at the summing amplifier or circuit when, for example, the differential mode noise is less than 100 mV.

In one aspect, a common-mode rejection receiver includes a first differential amplifier arranged to receive a differential signal including receiving a positive signal of the differential signal at a first non-inverting input port and receiving a negative signal of the differential signal at a first inverting input port. The first differential amplifier also outputs a first differentiated signal based on a voltage differential between the positive signal and the negative signal. The receiver includes a clamping circuit arranged to receive the first differentiated signal, limit a magnitude of the first differential signal to a pre-determined limit, and output a clamped signal. The receiver also includes a second differential amplifier arranged to receive the differential signal including receiving the positive signal of the differential signal at a second inverting input port and receiving the negative signal of the differential signal at a second non-inverting input port. The second differential amplifier also outputs a second differentiated signal based on a voltage differential between the positive signal and the negative signal. The receiver further includes a matching circuit arranged to receive the second differentiated signal and output a matched signal. The receiver also includes a summing circuit arranged to receive the clamped signal and the matched signal, add the clamped signal and matched signal, and output a receiver output signal based on a sum of the clamped signal and matched signal.

The pre-determined limit may be a fraction of a magnitude of the first differentiated signal. The pre-determined limit may be less than or equal to one of $\frac{1}{10}$, $\frac{1}{20}$, $\frac{1}{30}$, $\frac{1}{40}$ of the magnitude of the first differentiated signal. The pre-determined limit may be less than or equal to one of 100 mV, 50 mV, 33 mV, and 25 mV. The magnitude and/or amplitude of the second differentiated signal may be inverted with respect to the positive signal of the differential signal.

The matching circuit may be arranged to apply a voltage bias to the second differentiated signal similar to a voltage bias applied by the clamping circuit to the first differentiated signal. The clamping circuit may include at least one diode arranged to limit the magnitude of the first differentiated signal. The matching circuit may include at least one diode configured within the receiver to avoid limiting a magnitude of the second differentiated signal. The at least one diode of the matching circuit may be coupled to a power supply voltage of the receiver to avoid limiting the magnitude of the second differentiated signal.

In another aspect, a method for performing common-mode rejection at a receiver includes: receiving, at a first differential amplifier, a differential signal including receiving a positive signal of the differential signal at a first non-inverting input port and receiving a negative signal of the differential signal at a first inverting input port; outputting, from the first differential amplifier, a first differentiated signal based on a voltage differential between the positive signal and the negative signal; receiving, at a clamping circuit, the first differentiated signal; limiting, at the clamping circuit, a magnitude of the first differentiated signal to a pre-determined limit; receiving, at a second differential amplifier, the differential signal including receiving the positive signal of the differential signal at a second inverting input port and receiving the negative signal of the differential signal at a second non-inverting input port; outputting, from the second differential amplifier, a second differentiated signal based on a voltage differential between the positive signal and the negative signal; receiving, at a matching circuit, the second differentiated signal; outputting a matched signal from the matching circuit; receiving, at a summing circuit, the clamped signal and the matched signal; adding, at the summing circuit, the clamped signal and matched signal; and outputting, from the summing circuit, a receiver output signal based on a sum of the clamped signal and matched signal.

In a further aspect, a common-mode rejection system includes an input interface arranged to receive a differential signal. The system includes a first differential receiver circuit, coupled to the input interface, arranged to: i) receive the differential signal including receiving a positive signal of the differential signal at a first non-inverting input port and receiving a negative signal of the differential signal at a first inverting input port, and ii) output a first differentiated signal based on a voltage differential between the positive signal and the negative signal. The system also includes a clamping circuit arranged to receive the first differentiated signal, limit a magnitude of the first differentiated signal to a pre-determined limit, and output a clamped signal. The system includes a second differential receiver circuit, coupled to the input interface, arranged to: i) receive the differential signal including receiving the positive signal of the differential signal at a second inverting input port and receiving the negative signal of the differential signal at a second non-inverting input port, and ii) output a second differentiated signal based on a voltage differential between the positive signal and the negative signal. The system also includes a matching circuit arranged to receive the second differentiated signal and output a matched signal. The system further includes a summing circuit arranged to receive the clamped signal and the matched signal, add the clamped signal and matched signal, and output a receiver output signal based on a sum of the clamped signal and matched signal.

In this circuit design, regardless whether noise is being coupled to the positive side or negative side of the differential pair, the noise outputs of the two receivers have the same amplitude but opposite polarities, 180 degrees out of phase with each other. To cancel the noise, it is simply by adding the two signals together using the summing amplifier. For normal signals, due to clamping circuit described above, there is a 100 mV reduction in amplitude, which can be compensated by adding 100 mV gain at the summing amplifier.

Any two or more of the features described in this specification, including in this summary section, may be combined to form implementations not specifically described in this specification.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

The application, in various aspects, addresses deficiencies associated with existing common-mode rejection circuits. The application includes exemplary apparatuses, systems and methods for implementing a common-mode rejection circuit capable of rejection and/or suppressing unequal amounts of noise present in different phases of a differential signal such as, for example, the positive and negative signals of a differential signal pair.

Figure 1:
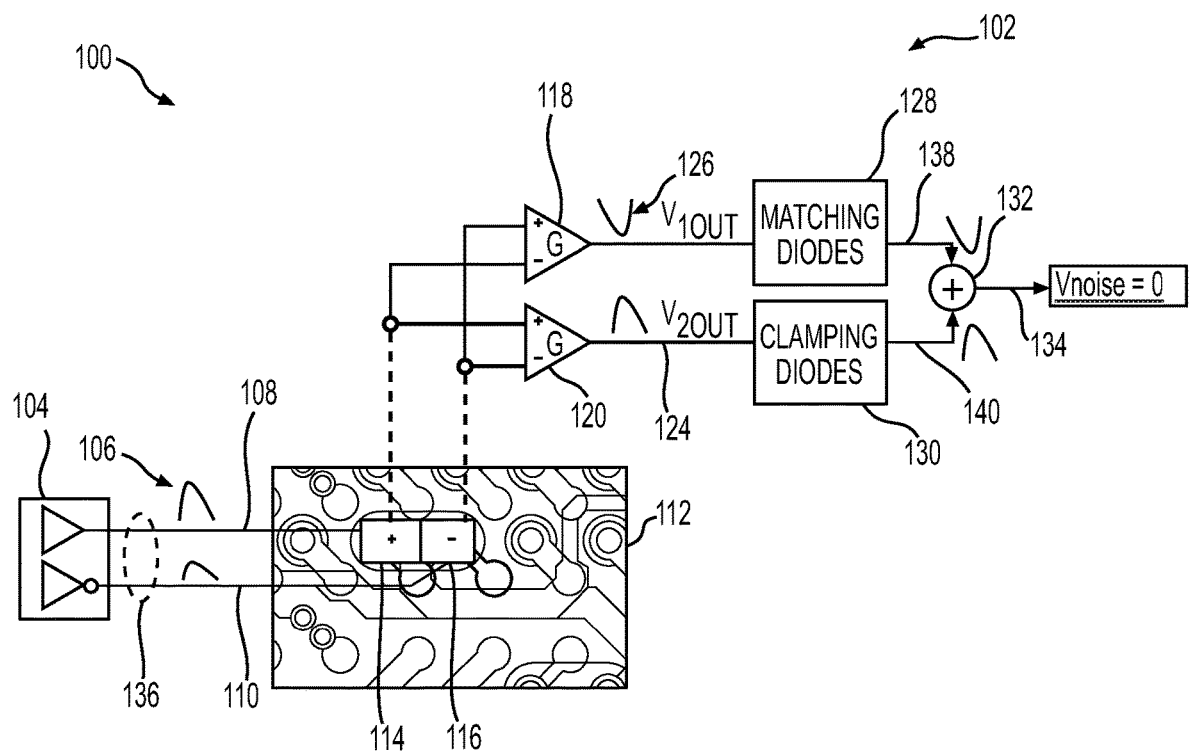
FIG. 1 is a simplified schematic diagram of a common-mode rejection system including receiver with more noise coupled to the positive signal than the negative signal of a received differential signal.

FIG. 1 is a simplified schematic diagram of a common-mode rejection system 100 including receiver 102 with more noise 106 coupled to the positive signal of a received differential signal 136. System 100 includes a differential signal pair transmitter 104 arranged to transmit a differential signal 136 and/or signal pair via, for example, a twisted pair line where the differential signal includes a positive signal 108 transmitted via a positive signal line, trace, and/or run and a negative signal 110 transmitted along a line, trace, and/or run. FIG. 1 shows that positive signal 108 includes noise 106, which is greater than noise included in the negative signal 110, thereby causing positive signal 108 to have a higher voltage amplitude than negative signal 110. Receiver 102 includes an input interface including positive terminal 114 and negative terminal 116. One or more of the components of receiver 102 may be implemented on a printed circuit board (PCB) 112.

Receiver 102 includes differential amplifiers 118 and 120 coupled to input terminals 114 and 116 which may include operational amplifiers (Op-amps), one or more transistors, and/or other components capable of implementing one or more amplifiers. Differential amplifier 120 receives positive signal 108 of received differential signal 136 via a positive and/or non-inverting input port and receives negative signal 110 of received differential signal 136 via a negative and/or inverting input port. Differential amplifier 120 may amplify the difference in voltage between positive signal 108 and negative signal 110 and output a differentiated and/or amplified signal 124 (e.g., $V_{2out}$). The differentiated and/or amplified signal 124 may be a single-end signal. Differential amplifier 118 receives the positive signal 108 of received differential signal 136 via a negative and/or inverting input port and receives negative signal 110 of received differential signal 136 via a positive and/or non-inverting input port. Differential amplifier 118 may amplify the difference in voltage between positive signal 108 and negative signal 110 and output a differentiated and/or amplified signal 122 which is inverted 126 with respect to positive signal 108 (e.g., Vi out). The differentiated and/or amplified signal 122 may be a single-end signal. Both differential amplifiers configured have the exact same gain, so the uneven noise coupled to 114 and 116 now have the same amplitude at the outputs of 118 and 120, but opposite in polarities, 180 degrees out-of-phase.

Matching circuit 128 receives differentiated signal 122 from differential amplifier 118, while clamping circuit 130 receives differentiated signal 124 from differential amplifier 120. Clamping circuit 130 may be configured to limit the converted and/or differentiated signal 124 to a pre-determined limit, which may be a fraction of a magnitude of differentiated signal 124. The pre-determined limit may be less than or equal to one of $\frac{1}{10}$, $\frac{1}{20}$, $\frac{1}{30}$, $\frac{1}{40}$ of the magnitude of the first differentiated signal. The pre-determined limit may be less than or equal to one of 100 mV, 50 mV, 33 mV, and 25 mV. Matching circuit 128 may be arranged to apply a voltage bias to differentiated signal 122 similar to a voltage bias applied by clamping circuit 130 to differentiated signal 124. A bias may include, for example, a voltage drop across the P-N junction of a diode in clamping circuit 130 and matching circuit 128. At least one diode of matching circuit 128 may be configured to avoid limiting a magnitude and/or amplitude of differentiated signal 122. At least one diode of matching circuit 128 may be coupled to a power supply voltage of receiver 102 to avoid limiting the magnitude and/or amplitude of differentiated signal 122.

Clamping circuit 130 outputs clamped signal 140, while matching circuit 128 outputs matched signal 138. Summing circuit 132 receives clamped signal 140 and matched signal 138, adds the signals, and outputs receiver output signal 134. As illustrated in FIG. 1, receiver 102 rejects and/or suppresses the addition noise 106 coupled to the positive signal 108 such that the receiver output signal 134 has substantially no noise (i.e., $V_{noise}=0$). FIG. 1 illustrates how receiver 102 advantageously suppresses and/or rejects uneven noise, i.e., additional noise coupled to positive signal 108 of differential signal pair 136, to overcome a technical problem associated with conventional common-mode rejection receivers that rely on noise being equally coupled to both signals of a differential signal pair.

Figure 2:
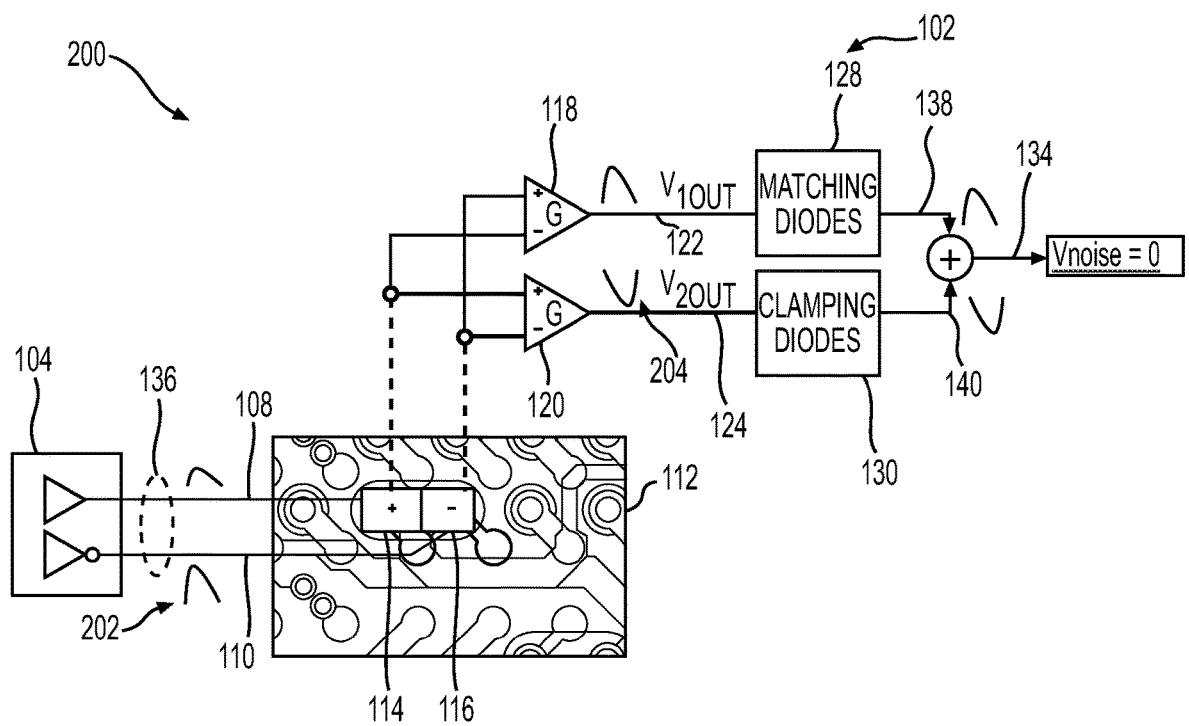
FIG. 2 is a simplified schematic diagram of the common-mode rejection system and receiver of FIG. 1 with more noise coupled to the negative signal than the positive of a received differential signal.

FIG. 2 is a simplified schematic diagram 200 of the common-mode rejection receiver 102 of FIG. 1 with additional noise 202 coupled to negative signal 110 of received differential signal 136. Differential signal pair transmitter 104 may be arranged to transmit a differential signal 136 and/or signal pair via, for example, a twisted pair line where the differential signal includes a positive signal 108 transmitted via a positive signal line, trace, and/or run and a negative signal 110 transmitted along a line, trace, and/or run. FIG. 2 shows that negative signal 110 includes noise 202, which is greater than noise included in positive signal 108, thereby causing negative signal 110 to have a higher voltage amplitude than positive signal 108. Receiver 102 includes an input interface including positive terminal 114 and negative terminal 116. One or more of the components of receiver 102 may be implemented on PCB 112.

Receiver 102 includes differential amplifiers 118 and 120 coupled to input terminals 114 and 116 which may include Op-amps configured to have the same gain, one or more transistors, and/or other components capable of implementing one or more amplifiers. Differential amplifier 120 receives positive signal 108 of received differential signal 136 via a positive and/or non-inverting input port and receives negative signal 110 of received differential signal 136 via a negative and/or inverting input port. Differential amplifier 120 may amplify the difference in voltage between positive signal 108 and negative signal 110 and output a differentiated and/or amplified signal 124 (e.g., $V_{2out}$). The differentiated and/or amplified signal 124 may be a single-end signal. Differentiated signal 124 is also inverted 204 in magnitude and/or amplitude with respect to noise 202 and/or negative signal 110.

Differential amplifier 118 receives the positive signal 108 of received differential signal 136 via a negative and/or inverting input port and receives negative signal 110 of received differential signal 136 via a positive and/or non-inverting input port. Differential amplifier 118 may amplify the difference in voltage between positive signal 108 and negative signal 110 and output a differentiated and/or amplified signal 122 (e.g., $V_{1out}$). The differentiated and/or amplified signal 122 may be a single-end signal.

The outputs of differential amplifiers 118 and 120 always have the same amplitude but opposite in phase, regardless whether or not the noise coupled to 110 is larger or lower than the noise coupled to 108.

Matching circuit 128 receives differentiated signal 122 from differential amplifier 118, while clamping circuit 130 receives differentiated signal 124 from differential amplifier 120. Clamping circuit 130 may be configured to limit the differentiated signal 124 to a pre-determined limit, which may be a fraction of a magnitude of differentiated signal 124. The pre-determined limit may be less than or equal to one of $\frac{1}{10}$, $\frac{1}{20}$, $\frac{1}{30}$, $\frac{1}{40}$ of the magnitude of the first differentiated signal. The pre-determined limit may be less than or equal to one of 100 mV, 50 mV, 33 mV, and 25 mV. Matching circuit 128 may be arranged to apply a voltage bias to differentiated signal 122 similar to a voltage bias applied by clamping circuit 130 to differentiated signal 124. A bias may include, for example, a voltage drop across the P-N junction of a diode in clamping circuit 130 and matching circuit 128. At least one diode of matching circuit 128 may be configured to avoid limiting a magnitude and/or amplitude of differentiated signal 122. At least one diode of matching circuit 128 may be coupled to a power supply voltage of receiver 102 to avoid limiting the magnitude and/or amplitude of differentiated signal 122.

Clamping circuit 130 outputs clamped signal 140, while matching circuit 128 outputs matched signal 138. Summing circuit 132 receives clamped signal 140 and matched signal 138, adds the signals, and outputs receiver output signal 134. As illustrated in FIG. 2, receiver 102 rejects and/or suppresses the addition noise 202 coupled to negative signal 110 such that the receiver output signal 134 has substantially no noise (i.e., $V_{noise}=0$). FIG. 2 illustrates how receiver 102 advantageously suppresses and/or rejects uneven noise, i.e., additional noise coupled to negative signal 110 of differential signal pair 136, to overcome a technical problem associated with conventional common-mode rejection receivers that rely on noise being equally coupled to both signals of a differential signal pair.

Figure 3:
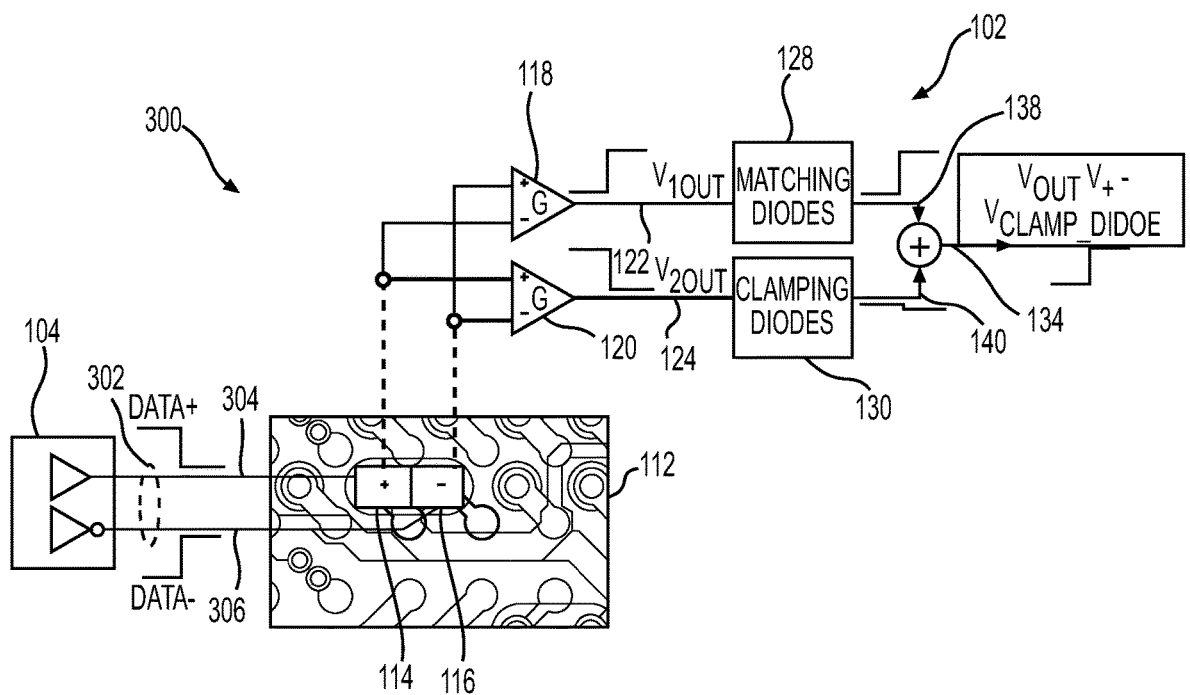
FIG. 3 is another simplified schematic diagram of a common-mode rejection system including a receiver illustrating processing of a differential data signal.

FIG. 3 is a simplified schematic diagram 300 of the common-mode rejection receiver 102 of FIG. 1 processing of a differential data signal 302 including a positive data signal 304 and negative data signal 306. Differential signal pair transmitter 104 may be arranged to transmit the differential data signal 302 and/or signal pair via, for example, a twisted pair line where the differential signal 302 includes a positive data signal 304 transmitted via a positive signal line, trace, and/or run and a negative data signal 306 transmitted along a line, trace, and/or run. Uneven or unequal noise may be coupled to the positive and negative data signals 302 and 304 which could adversely affect the quality of signal recovery by receiver 102. Receiver 102 includes an input interface including positive terminal 114 and negative terminal 116. One or more of the components of receiver 102 may be implemented on PCB 112.

Receiver 102 may include differential amplifiers 118 and 120 coupled to input terminals 114 and 116 which may include Op-amps, one or more transistors, and/or other components capable of implementing one or more amplifiers. Differential amplifier 120 receives positive data signal 304 of received differential data signal 302 via a positive and/or non-inverting input port and receives negative data signal 306 of received differential signal 302 via a negative and/or inverting input port. Differential amplifier 120 may amplify the difference in voltage between positive data signal 304 and negative data signal 306 and output a differentiated and/or amplified signal 124 (e.g., $V_{2out}$). The differentiated and/or amplified signal 124 may be a single-end signal. Differentiated signal 124 is also inverted in magnitude and/or amplitude with respect to negative data signal 306.

Differential amplifier 118 receives the positive data signal 304 of received differential signal 302 via a negative and/or inverting input port and receives negative data signal 306 of received differential data signal 302 via a positive and/or non-inverting input port. Differential amplifier 118 may amplify the difference in voltage between positive data signal 304 and negative data signal 306 and output a differentiated and/or amplified signal 122 (e.g., $V_{1out}$). The differentiated and/or amplified signal 122 may be a single-end signal.

Matching circuit 128 receives differentiated signal 122 from differential amplifier 118, while clamping circuit 130 receives differentiated signal 124 from differential amplifier 120. Clamping circuit 130 may be configured to limit the differentiated signal 124 to a pre-determined limit, which may be a fraction of a magnitude of differentiated signal 124. The pre-determined limit may be less than or equal to one of 1/10, 1/20, 1/30, 1/40 of the magnitude of the first differentiated signal. The pre-determined limit may be less than or equal to one of 100 mV, 50 mV, 33 mV, and 25 mV. Matching circuit 128 may be arranged to apply a voltage bias to differentiated signal 122 similar to a voltage bias applied by clamping circuit 130 to differentiated signal 124. A bias may include, for example, a voltage drop across the P-N junction of a diode in clamping circuit 130 and matching circuit 128. At least one diode of matching circuit 128 may be configured to avoid limiting a magnitude and/or amplitude of differentiated signal 122. At least one diode of matching circuit 128 may be coupled to a power supply voltage of receiver 102 to avoid limiting the magnitude and/or amplitude of differentiated signal 122.

Figure 4:
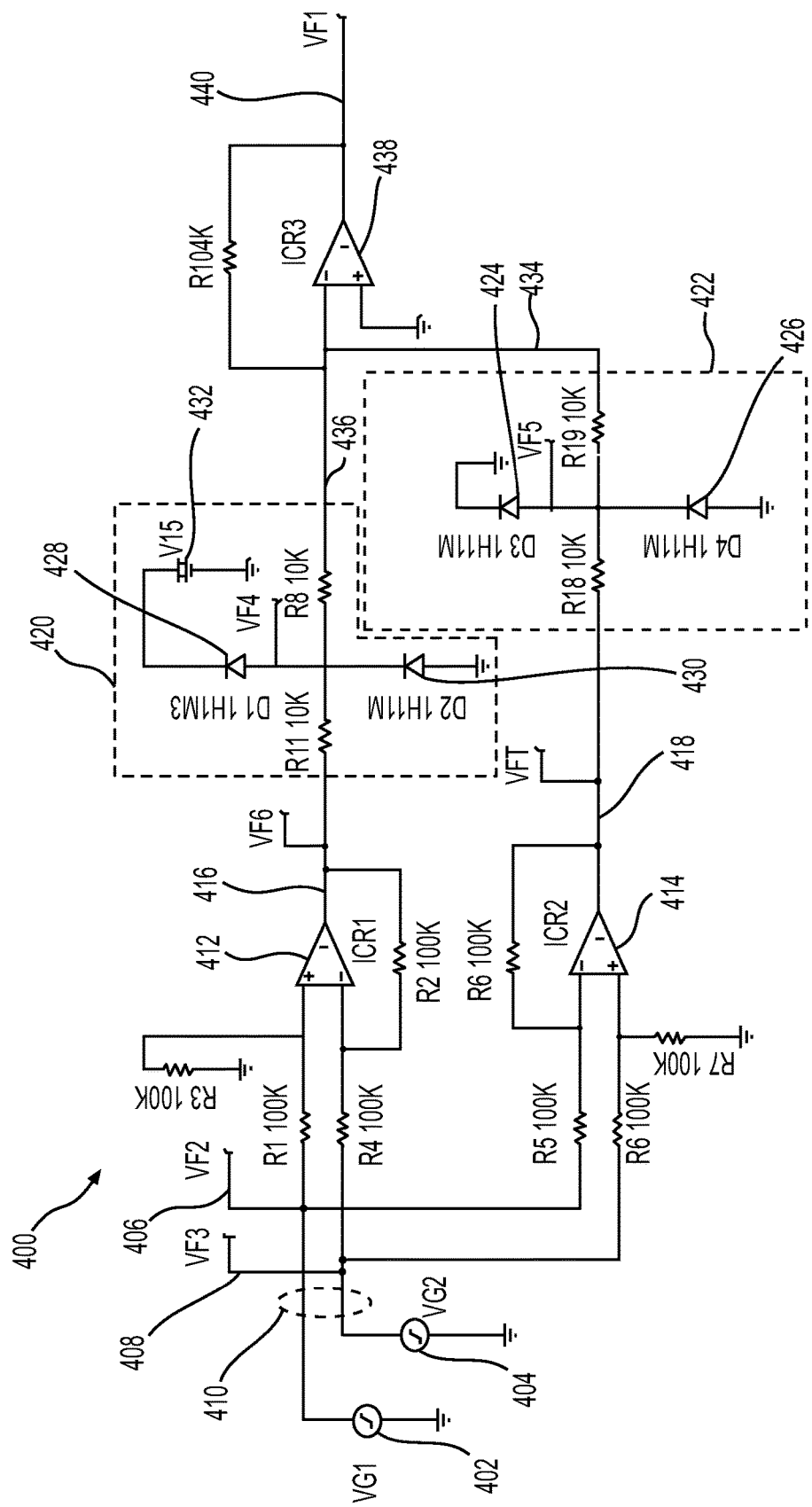
FIG. 4 is a schematic diagram of an exemplary common-mode rejection receiver circuit.

Clamping circuit 130 outputs clamped signal 140, while matching circuit 128 outputs matched signal 138. Summing circuit 132 receives clamped signal 140 and matched signal 138, adds the signals, and outputs receiver output signal 134. As illustrated in FIG. 3, receiver 102 rejects and/or suppresses any unequal noise or excessive noise coupled to positive data signal 304 or negative data signal 306 such that the receiver output signal 134 has substantially no noise (i.e., $V_{noise}=0$). FIG. 3 illustrates how receiver 102 advantageously suppresses and/or rejects uneven noise, i.e., additional noise coupled to either positive data signal 304 or negative data signal 306 of differential data signal pair 302, to overcome a technical problem associated with conventional common-mode rejection receivers that rely on noise being equally coupled to both signals of a differential signal pair. The following are formulas associated with operations of receiver 102 including:

1) $V_{1out}=G(V--V+)$ where G is the gain of the amplifier 118, V+ is the positive signal input, and V− is the negative signal input.
2) $V_{2out}=G(V+-V-)$ where G is the gain of the amplifier 102, V+ is the positive signal input, and V− is the negative signal input.
3) $Vout=V+-V_{clamp\_diode}$ where V+ is the positive signal input, and $V_{clamp-diode}$ is the output from clamping circuit 130, FIG. 4 is a schematic diagram of an exemplary common-mode rejection receiver circuit 400. Single generator 402 generates a positive data signal 406 and signal generator 404 generates a negative data signal 408. Positive data signal 406 and negative data signal 408 form a differential data signal 410. Uneven or unequal noise may be coupled to the positive and negative data signals 406 and 408 which could adversely affect the quality of signal recovery by a receiver. One or more of the components of receiver 400 may be implemented on a PCB such as PCB 112.

Receiver 400 may include differential amplifiers 412 and 414 coupled to signal generators 402 and 404 respectively which may include Op-amps, one or more transistors, and/or other components capable of implementing one or more amplifiers. Differential amplifier 412 receives positive data signal 406 of received differential data signal 410 via a positive and/or non-inverting input port and receives negative data signal 408 of received differential signal 410 via a negative and/or inverting input port. Differential amplifier 412 may amplify the difference in voltage between positive data signal 406 and negative data signal 408 and output a differentiated, converted, and/or amplified signal 416 (e.g., $V_{2out}$). The differentiated and/or amplified signal 416 may be a single-end signal.

Differential amplifier 414 receives the positive data signal 406 of received differential signal 410 via a negative and/or inverting input port and receives negative data signal 408 of received differential data signal 410 via a positive and/or non-inverting input port. Differential amplifier 414 may amplify the difference in voltage between positive data signal 406 and negative data signal 408 and output a differentiated, converted, and/or amplified signal 418 (e.g., $V_{1out}$). The differentiated and/or amplified signal 418 may be a single-end signal.

Matching circuit 420 receives differentiated signal 416 from differential amplifier 412, while clamping circuit 422 receives differentiated signal 418 from differential amplifier 414. Clamping circuit 422 may be configured to limit the differentiated signal 418 to a pre-determined limit, which may be a fraction of a magnitude of differentiated signal 418. The pre-determined limit may be less than or equal to one of 1/10, 1/20, 1/30, 1/40 of the magnitude of the first differentiated signal. The pre-determined limit may be less than or equal to one of 100 mV, 50 mV, 33 mV, and 25 mV. Clamping circuit 422 may include clamping diode 424 and diode 426 where clamping diode 424 is configured to limit differentiated signal 418 to the pre-determined limit.

Matching circuit 420 may be arranged to apply a voltage bias to differentiated signal 416 similar to a voltage bias applied by clamping circuit 422 to differentiated signal 418. A bias may include, for example, a voltage drop across the P-N junction of a clamping diode 424 in clamping circuit 422. At least one diode of matching circuit 420 such as matching diode 428 and/or diode 430 may be configured to avoid limiting a magnitude and/or amplitude of differentiated signal 416. For example, matching diode 428 may be coupled to a power supply voltage 428 of receiver 400 to avoid limiting the magnitude and/or amplitude of differentiated signal 416.

Clamping circuit 422 outputs clamped signal 434, while matching circuit 420 outputs matched signal 436. Summing amplifier 438 receives clamped signal 434 and matched signal 436 at an inverting input port, adds the signals, and outputs receiver output signal 440. Because the two input signals, 434 and 436, have the same amplitude but are 180 degrees out of phase, the Summing amplifier 438 cancels all the noise less than or equal to the pre-determined value by simply adding the two signals together. And the Summing amplifier may amplify and/or apply a gain to its input to compensate of any attenuation caused by subtracting the clamped signal 434 from the matched signal 436. In some implementations, one or more additional amplifiers may be coupled to summing amplifier 438 to further amplify and/or add gain to receiver output signal 440.

Figure 5:
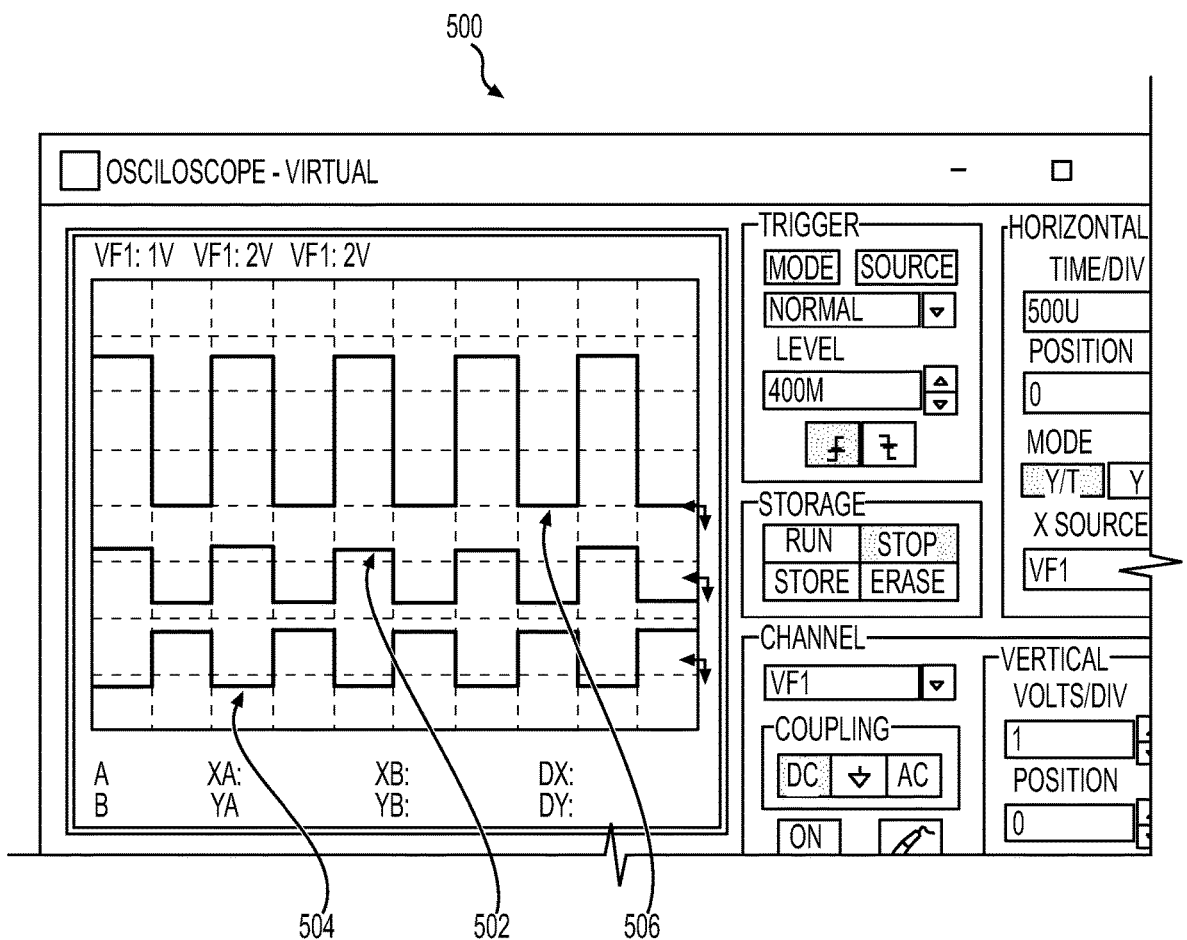
FIG. 5 shows a plot of an input differential signal pair and plot of the single-end output signal from the circuit of FIG. 4 during a noise-free input signal condition.

As illustrated in FIG. 4, receiver 400 rejects and/or suppresses any unequal noise or excessive noise coupled to positive data signal 406 or negative data signal 408 such that the receiver output signal 440 has substantially no noise (i.e., $V_{noise}=0$). FIG. 4 illustrates how receiver 400 advantageously suppresses and/or rejects uneven noise, i.e., additional noise coupled to either positive data signal 406 or negative data signal 408 of differential data signal pair 410, to overcome a technical problem associated with conventional common-mode rejection receivers that rely on noise being equally coupled to both signals of a differential signal pair. Furthermore, summing amplifier 438 may advantageously cancel, suppress, and/or reject differential mode noise when, for example, the differential mode noise is less than 100 mV FIG. 5 shows plots 500 of the input differential signal pair 410 and the single-end receiver output signal 440 of receiver circuit 400 of FIG. 4 during a noise-free input signal condition. FIG. 5 shows waveform 502 associated with positive data signal 406 and waveform 504 associated with negative data signal 408, where each square wave waveform 502 and 504 have about a 0.5 V amplitude. Waveform 506 is associated with receiver output signal 440 which illustrates how receiver 400 converts differential signal 410 into a single-ended output square wave signal of about 1.0 V that is free from noise.

Figure 6:
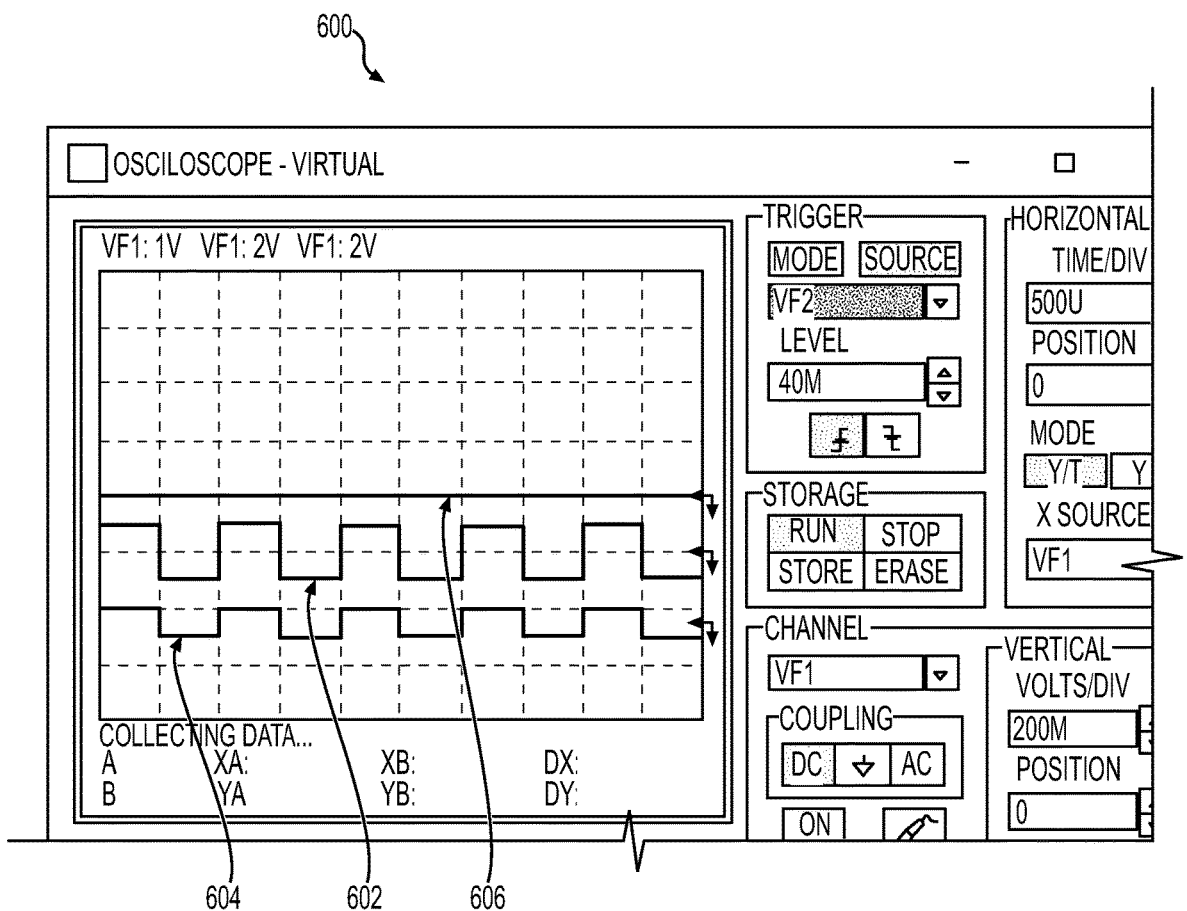
FIG. 6 shows a plot of an input differential signal pair and plot of the single-end output noise from the circuit of FIG. 4 where different amounts of noise are present in the received positive and negative signals of the received differential signal pair.

FIG. 6 shows plots 600 of uneven common-mode noise being applied to receiver circuit 400. Plots 600 show 200 mV of noise added to positive data signal 406 as waveform 602 and 100 mV of noise added to negative data signal 408 as waveform 604. Plots 600 further shows how receiver circuit 400 rejects the uneven common-mode noise by illustrating that the single-end output noise 606 remains substantially at 0 V. While FIG. 600 illustrates how receiver circuit 400 rejects and/or suppresses uneven input noise where noise in the positive signal 406 is greater than the negative signal 408, receiver circuit 400 is also capable of rejecting and/or suppressing common-mode noise where noise in the negative signal 408 is greater than the positive signal 406.

Figure 7:
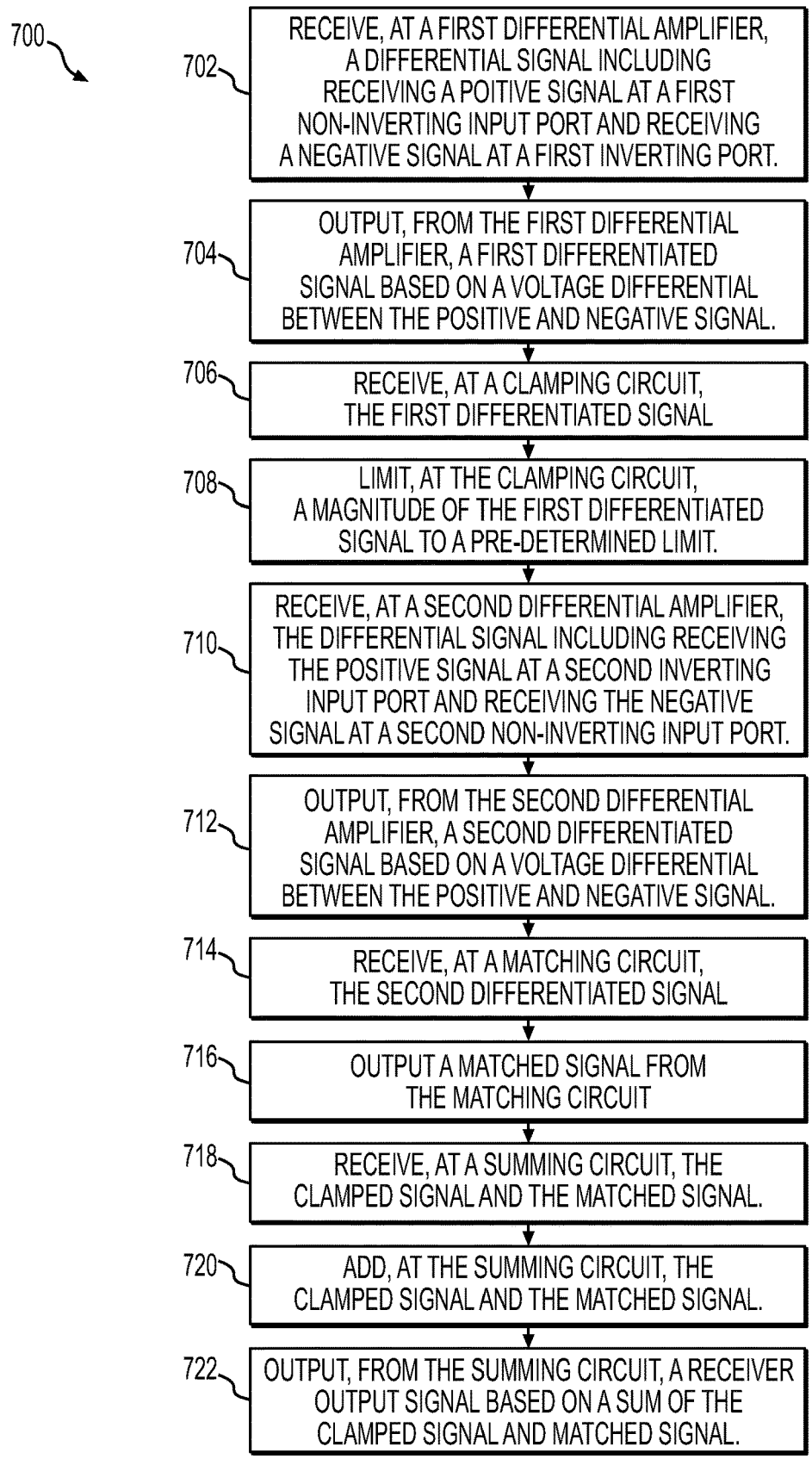
FIG. 7 includes a process for performing common-mode rejection at a receiver.

FIG. 7 includes a process 700 for performing common-mode rejection at a receiver such as receivers 102 and 400 which includes: receiving, at a first differential amplifier, a differential signal including receiving a positive signal of the differential signal at a first non-inverting input port and receiving a negative signal of the differential signal at a first inverting input port (Step 702); outputting, from the first differential amplifier, a first differentiated signal based on a voltage differential between the positive signal and the negative signal (704); receiving, at a clamping circuit, the first differentiated signal (706); limiting, at the clamping circuit, a magnitude of the first differentiated signal to a pre-determined limit (708); receiving, at a second differential amplifier, the differential signal including receiving the positive signal of the differential signal at a second inverting input port and receiving the negative signal of the differential signal at a second non-inverting input port (710); outputting, from the second differential amplifier, a second differentiated signal based on a voltage differential between the positive signal and the negative signal (712); receiving, at a matching circuit, the second differentiated signal (714); outputting a matched signal from the matching circuit (716); receiving, at a summing circuit, the clamped signal and the matched signal (718); adding, at the summing circuit, the clamped signal and matched signal (720); and outputting, from the summing circuit, a receiver output signal based on a sum of the clamped signal and matched signal (722).

Elements or steps of different implementations described may be combined to form other implementations not specifically set forth previously. Elements or steps may be left out of the systems or processes described previously without adversely affecting their operation or the operation of the system in general. Furthermore, various separate elements or steps may be combined into one or more individual elements or steps to perform the functions described in this specification.

Other implementations not specifically described in this specification are also within the scope of the following claims.

What is claimed is:
1. A common-mode rejection receiver comprising:
   a first differential amplifier arranged to: i) receive a differential signal including receiving a positive signal of the differential signal at a first non-inverting input port and receiving a negative signal of the differential signal at a first inverting input port, and ii) output a first differentiated signal based on a voltage differential between the positive signal and the negative signal;
   a clamping circuit arranged to receive the first differentiated signal, limit a magnitude of the first differentiated signal to a pre-determined limit, and output a clamped signal;
   a second differential amplifier arranged to: i) receive the differential signal including receiving the positive signal of the differential signal at a second inverting input port and receiving the negative signal of the differential signal at a second non-inverting input port, and ii) output a second differentiated signal based on a voltage differential between the positive signal and the negative signal;

a matching circuit arranged to receive the second differentiated signal and output a matched signal; and a summing circuit arranged to receive the clamped signal and the matched signal, add the clamped signal and matched signal, and output a receiver output signal based on a sum of the clamped signal and matched signal.

2. The receiver of claim 1, wherein the pre-determined limit is a fraction of a magnitude of the first differentiated signal.

3. The receiver of claim 2, wherein the pre-determined limit is less than or equal to one of 1/10, 1/20, 1/30, and 1/40 of the magnitude of the first differentiated signal.

4. The receiver of claim 3, wherein the pre-determined limit is less than or equal to one of 100 mV, 50 mV, 33 mV, and 25 mV.

5. The receiver of claim 1, wherein a magnitude of the second differentiated signal is inverted, 180 degrees out-of-phase, with respect to the positive signal of the differential signal.

6. The receiver of claim 1, wherein the matching circuit is arranged to apply a voltage bias to the second differentiated signal similar to a voltage bias applied by the clamping circuit to the first differentiated signal.

7. The receiver of claim 1, wherein the clamping circuit includes at least one diode arranged to limit the magnitude of the first differentiated signal and the matching circuit includes at least one diode.

8. The receiver of claim 7, wherein the at least one diode of the matching circuit is configured within the receiver to avoid limiting a magnitude of the second differentiated signal.

9. The receiver of claim 1, wherein the summing circuit is arranged to cancel differential mode noise within the differential signal by adding the clamped signal and matched signal.

10. The receiver of claim 9, wherein the at least one diode of the matching circuit is coupled to a power supply voltage of the receiver to avoid limiting the magnitude of the second differentiated signal.

11. A method for performing common-mode rejection at a receiver comprising:

receiving, at a first differential amplifier, a differential signal including receiving a positive signal of the differential signal at a first non-inverting input port and receiving a negative signal of the differential signal at a first inverting input port;

outputting, from the first differential amplifier, a first differentiated signal based on a voltage differential between the positive signal and the negative signal;

receiving, at a clamping circuit, the first differentiated signal;

limiting, at the clamping circuit, a magnitude of the first differentiated signal to a pre-determined limit;

receiving, at a second differential amplifier, the differential signal including receiving the positive signal of the differential signal at a second inverting input port and receiving the negative signal of the differential signal at a second non-inverting input port;

outputting, from the second differential amplifier, a second differentiated signal based on a voltage differential between the positive signal and the negative signal;

receiving, at a matching circuit, the second differentiated signal;

outputting a matched signal from the matching circuit;

receiving, at a summing circuit, the clamped signal and the matched signal;

adding, at the summing circuit, the clamped signal and matched signal; and outputting, from the summing circuit, a receiver output signal based on a sum of the clamped signal and matched signal.

12. The method of claim 11, wherein the pre-determined limit is a fraction of a magnitude of the first differentiated signal.

13. The method of claim 12, wherein the pre-determined limit is less than or equal to one of 1/10, 1/20, 1/30, and 1/40 of the magnitude of the first differentiated signal.

14. The method of claim 13, wherein the pre-determined limit is less than or equal to one of 100 mV, 50 mV, 33 mV, and 25 mV.

15. The method of claim 11, wherein a magnitude of the second differentiated signal is inverted with respect to the positive signal of the differential signal.

16. The method of claim 11 comprising configuring the matching circuit to apply a voltage bias to the second differentiated signal similar to a voltage bias applied by the clamping circuit to the first differentiated signal.

17. The method of claim 11, wherein the clamping circuit includes at least one diode arranged to limit the magnitude of the first differentiated signal and the matching circuit includes at least one diode.

18. The method of claim 17 comprising configuring the at least one diode of the matching circuit within the receiver to avoid limiting a magnitude of the second differentiated signal.

19. The method of claim 18 comprising coupling the at least one diode of the matching circuit to a power supply voltage of the receiver to avoid limiting the magnitude of the second differentiated signal.

20. A common-mode rejection system comprising:

an input interface arranged to receive a differential signal;

a first differential receiver circuit, coupled to the input interface, arranged to: i) receive the differential signal including receiving a positive signal of the differential signal at a first non-inverting input port and receiving a negative signal of the differential signal at a first inverting input port, and ii) output a first differentiated signal based on a voltage differential between the positive signal and the negative signal;

a clamping circuit arranged to receive the first differentiated signal, limit a magnitude of the first differentiated signal to a pre-determined limit, and output a clamped signal;

a second differential receiver circuit, coupled to the input interface, arranged to: i) receive the differential signal including receiving the positive signal of the differential signal at a second inverting input port and receiving the negative signal of the differential signal at a second non-inverting input port, and ii) output a second differentiated signal based on a voltage differential between the positive signal and the negative signal;

a matching circuit arranged to receive the second differentiated signal and output a matched signal; and a summing circuit arranged to receive the clamped signal and the matched signal, add the clamped signal and matched signal, and output a receiver output signal based on a sum of the clamped signal and matched signal.

* * * * *